(12) United States Patent
Lee et al.

(10) Patent No.: US 9,018,733 B1
(45) Date of Patent: Apr. 28, 2015

(54) CAPACITOR, STORAGE NODE OF THE CAPACITOR, AND METHOD OF FORMING THE SAME

(71) Applicant: Inotera Memories, Inc., Taoyuan (TW)

(72) Inventors: Tzung-Han Lee, Taipei (TW);
Yaw-Wen Hu, Taoyuan County (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 14/201,932

(22) Filed: Mar. 10, 2014

(51) Int. Cl.
*H01L 21/02* (2006.01)
*H01L 49/02* (2006.01)
*H01L 27/108* (2006.01)

(52) U.S. Cl.
CPC .............. *H01L 28/60* (2013.01); *H01L 27/108* (2013.01); *H01L 28/90* (2013.01)

(58) Field of Classification Search
CPC ........ H01L 28/60; H01L 28/90; H01L 27/108
USPC ....................................................... 257/532
See application file for complete search history.

(56) References Cited

U.S. PATENT DOCUMENTS

| | | | |
|---|---|---|---|
| 6,091,094 A | 7/2000 | Rupp | |
| 7,067,385 B2 * | 6/2006 | Manning | 438/387 |
| 7,125,781 B2 * | 10/2006 | Manning et al. | 438/397 |
| 7,199,005 B2 * | 4/2007 | Sandhu et al. | 438/244 |
| 7,226,845 B2 * | 6/2007 | Manning et al. | 438/386 |
| 7,271,051 B2 * | 9/2007 | Manning et al. | 438/238 |
| 7,387,939 B2 * | 6/2008 | Manning | 438/396 |
| 7,393,741 B2 * | 7/2008 | Sandhu et al. | 438/244 |
| 7,393,743 B2 * | 7/2008 | Manning | 438/253 |
| 7,420,238 B2 * | 9/2008 | Manning et al. | 257/301 |
| 7,445,991 B2 * | 11/2008 | Manning | 438/253 |
| 7,449,391 B2 * | 11/2008 | Manning et al. | 438/396 |
| 7,517,753 B2 * | 4/2009 | Manning | 438/253 |
| 7,534,694 B2 * | 5/2009 | Manning | 438/397 |
| 7,544,563 B2 * | 6/2009 | Manning | 438/253 |
| 7,585,741 B2 * | 9/2009 | Manning | 438/396 |
| 7,655,968 B2 * | 2/2010 | Manning | 257/302 |
| 7,736,987 B2 * | 6/2010 | Manning et al. | 438/396 |
| 7,781,818 B2 * | 8/2010 | Manning et al. | 257/304 |
| 7,825,451 B2 * | 11/2010 | Manning | 257/306 |

(Continued)

FOREIGN PATENT DOCUMENTS

TW   201115688 A1   5/2011

OTHER PUBLICATIONS

"A Mechanically Enhanced Storage node for virtually unlimited Height (MESH) Capacitor Aiming at sub 70nm DRAMs"; D.H. Kim, et al; 2004 IEEE; pp. 3.4.1-3.4.4.*

*Primary Examiner* — Nicholas Tobergte
(74) *Attorney, Agent, or Firm* — Winston Hsu; Scott Margo

(57) ABSTRACT

A semiconductor structure includes a substrate having thereon at least one conductive region; a plurality of cylinder-shaped electrodes disposed on the substrate, wherein each of the cylinder-shaped electrodes has a horizontal portion that is in direct contact with the at least one conductive region and a vertical sidewall portion connecting the horizontal portion; an upper support structure comprising a first lattice structure that is situated in a first horizontal level that is lower than a tip portion of each of the cylinder-shaped electrodes; and a lower support structure comprising a second lattice structure that interlocks middle portions of the cylinder-shaped electrodes.

11 Claims, 7 Drawing Sheets

(56) References Cited

U.S. PATENT DOCUMENTS

| | | | |
|---|---|---|---|
| 7,858,486 B2 * | 12/2010 | Manning | 438/396 |
| 8,139,341 B2 | 3/2012 | Kato | |
| 8,154,064 B2 * | 4/2012 | Manning et al. | 257/304 |
| 8,519,463 B2 * | 8/2013 | Manning et al. | 257/304 |
| 2010/0078618 A1 | 4/2010 | Xiao | |

* cited by examiner

CAPACITOR, STORAGE NODE OF THE CAPACITOR, AND METHOD OF FORMING THE SAME

BACKGROUND OF THE INVENTION

1. Field of the Invention

The present invention relates generally to a semiconductor structure. More specifically, the present invention relates to a capacitor or a cylinder-shaped storage node structure of a capacitor, which can be applicable to high-density dynamic random access memory (DRAM) devices.

2. Description of the Prior Art

As the level of integration continues to increase in integrated circuitry, electronic components are formed to increasing the smaller dimensions. One type of component utilized in integrated circuitry is a capacitor. It is well known that capacitors may serve as charge storage elements of dynamic random access memory (DRAM) devices.

Capacitors are becoming increasingly tall and thin in an effort to reduce the footprint of individual capacitors, and thereby conserve semiconductor real estate. Current capacitor dimensions are approaching the limits attainable by conventional processing, and it is desired to develop new processing so that capacitors may be scaled to increasingly thinner dimensions.

A common capacitor construction is a so-called container-shaped storage node device. The container-shaped storage nodes are first formed within densely-packed, high-aspect-ratio holes etched into a template or support structure. After removing the template layer, a dielectric material and a capacitor cell plate are formed on the container. Unfortunately, high aspect-ratio container-shaped storage nodes are structurally weak, and subject to toppling, twisting and/or breaking from an underlying base.

To avoid toppling of high aspect-ratio container-shaped storage node, a lattice methodology has been developed. Typically, a single lattice layer is provided to retain the uppermost position of the container-shaped electrodes.

SUMMARY OF THE INVENTION

According to one aspect of the invention, a semiconductor structure includes a substrate having thereon at least one conductive region; a plurality of cylinder-shaped electrodes disposed on the substrate, wherein each of the cylinder-shaped electrodes has a horizontal portion that is in direct contact with the at least one conductive region and a vertical sidewall portion connecting the horizontal portion; an upper support structure comprising a first lattice structure that is situated in a first horizontal level that is lower than a tip portion of each of the cylinder-shaped electrodes; and a lower support structure comprising a second lattice structure that interlocks middle portions of the cylinder-shaped electrodes. The upper support structure and the lower support structure prevent the cylinder-shaped electrodes from toppling.

According to one embodiment, the upper support structure further comprises an annular spacer disposed around the tip portion of each of the cylinder-shaped electrodes. The annular spacer may comprise silicon oxide or polysilicon.

According to one embodiment, the annular spacer, the upper support structure, and the lower support structure have substantially the same pattern.

According to one embodiment, the first lattice structure and the second lattice structure comprise silicon nitride.

According to one embodiment, discontinuous gaps are dispersed around each of the cylinder-shaped electrodes.

According to one embodiment, the semiconductor structure further comprises a capacitor dielectric layer conformally covers the cylinder-shaped electrodes, the upper support structure, and the lower support structure. A capacitor electrode is disposed on the capacitor dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
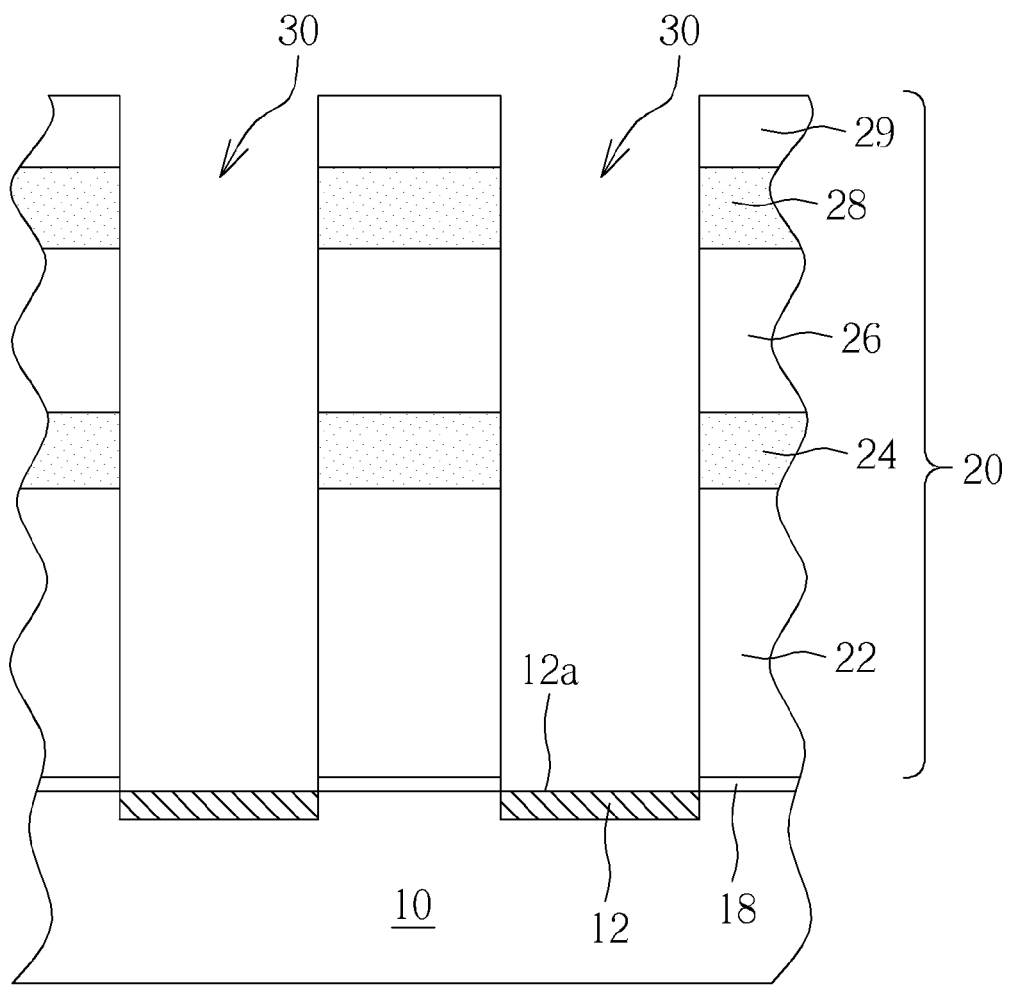
FIGS. 1-6 are cross-sectional views schematically depicting a process flow for manufacturing a capacitor structure in accordance with one embodiment of present invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The terms "semiconductive substrate," "semiconductor construction" and "semiconductor substrate" used herein include any construction comprising semiconductive materials, including, but not limited to, bulk semiconductive materials such as a semiconductive wafer (either alone or in assemblies comprising other materials), and semiconductive material regions (either alone or in assemblies comprising other materials). The term "substrate" refers to any supporting structure, including, but not limited to, the semiconductive substrates described above.

The term "horizontal" as used herein is defined as a plane parallel to the conventional major plane or surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

FIGS. 1-6 are cross-sectional views schematically depicting a process for manufacturing a capacitor structure in accordance with one embodiment of present invention. As shown in FIG. 1, a substrate 10 is provided to serve as a base for forming devices, components, or circuits. The substrate 10 may comprise, consist essentially of, or consist of monocrystalline silicon, and may be referred to as a semiconductor substrate, or as a portion of a semiconductor substrate. Although the substrate 10 in this embodiment is shown to be homogenous, the substrate 10 may comprise numerous materials in some embodiments. For instance, the substrate 10 may correspond to a semiconductor substrate containing one or more materials associated with integrated circuit fabrication. In such embodiments, such materials may correspond to one or more of refractory metal materials, barrier materials, diffusion materials, insulator materials, etc.

According to the embodiment, at least one conductive region 12 is disposed in the substrate 10. For example, the conductive region 12 may be a source/drain doping region, a contact, or a landing pad. In a case that the conductive region 12 is a landing pad, for example, a contact plug (not shown) may be disposed underneath the landing pad to couple the landing pad to a source/drain doping region. Initially, a top surface 12a of the conductive region 12 may be covered by a stop layer 18, for example, an etching stop layer. In a later stage, as described herein below, the top surface 12a of the conductive region 12 will be revealed. According to the embodiment, the stop layer 18 may include but not limited to silicon nitride or silicon oxy-nitride.

Atop the stop layer 18, a template structure 20 is provided. According to the embodiment, the template structure 20 may comprise a first sacrificial layer 22 that is directly deposited onto the stop layer 18, a first lattice layer 24 on the first sacrificial layer 22, a second sacrificial layer 26 on the first lattice layer 24, a second lattice layer 28 on the second sacrificial layer 26, and a capping top layer 29 on the second lattice layer 28. According to the embodiment, the first sacrificial layer 22 and the second sacrificial layer 26 may comprise the same dielectric material, for example, silicon oxide, borophosphosilicate glass (BPSG), phosphosilicate glass (PSG), fluorosilicate glass, or spin-on-dielectric (SOD). The first lattice layer 24 and the second lattice layer 28 may comprise the same dielectric material, for example, silicon nitride.

According to the embodiment, the composition of the first sacrificial layer 22 and the second sacrificial layer 26 may be different from the composition of the first lattice layer 24 and the second lattice layer 28 to exhibit adequate etching selectivity. The capping top layer 29 may comprise a dielectric layer that can be removed selectively from the underlying second lattice layer 28. For example, the capping top layer 29 may comprise silicon oxide. According to the embodiment, the total thickness of the template structure 20 may range between 15000 angstroms and 20000 angstroms, for example.

Still referring to FIG. 1, a photolithographic process and a dry etching process are carried out to form a cluster of densely packed openings 30 extending through the entire thickness of the template structure 20. According to the embodiment, each of the openings 30 may have a diameter that is close to or beyond the exposure limit of the lithographic process utilized to define the pattern of the each of the openings 30. The openings 30 correspond to the underlying conductive region 12. Each of the openings 30 at least exposes a portion of the top surface 12a of each of the conductive region 12.

Figure 2:
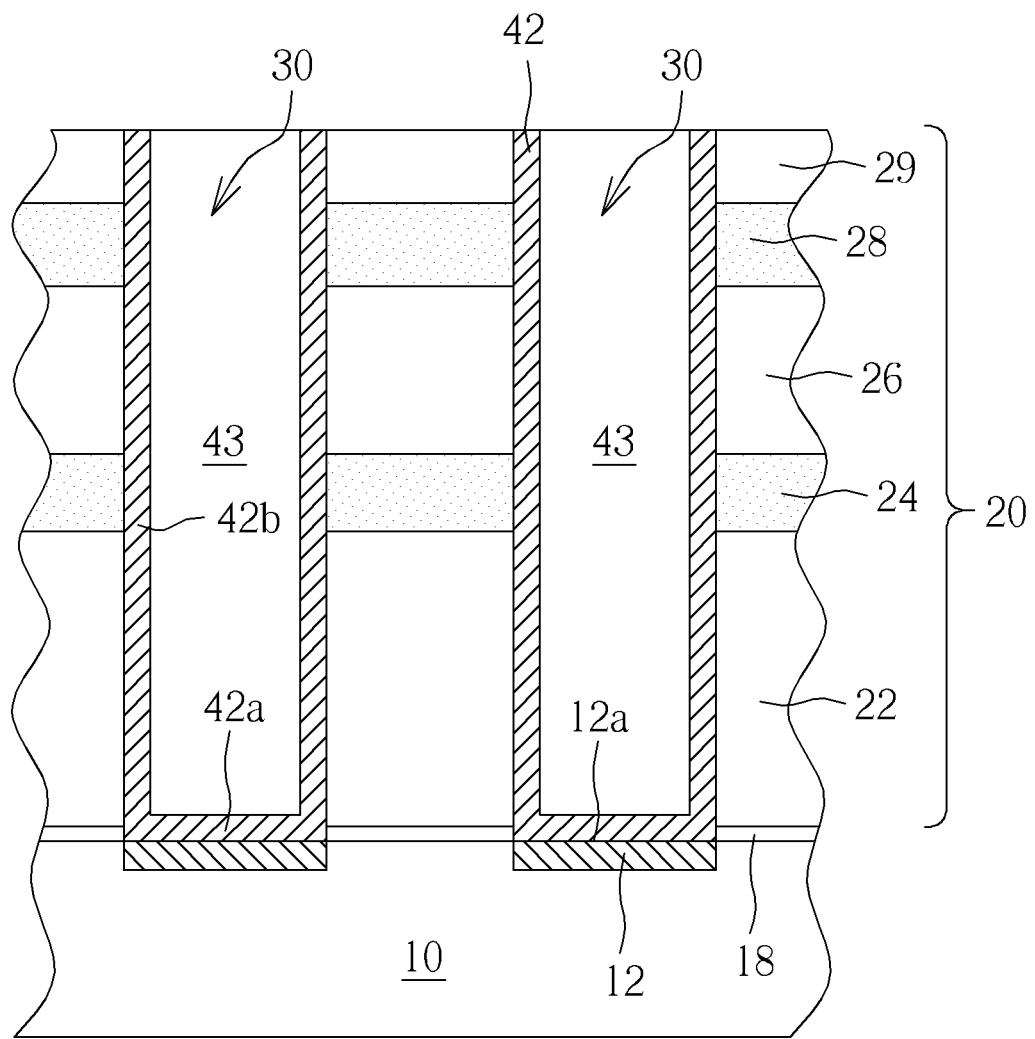

As shown in FIG. 2, cylinder-shaped storage nodes 42 are formed within the densely-packed, high-aspect-ratio openings 30, respectively. To form the cylinder-shaped storage nodes 42, a conformal conductive layer (not explicitly shown) such as a titanium nitride film is deposited over the substrate 10. The conformal conductive layer covers the top surface of the capping top layer 29 and the interior surfaces of the openings 30. A chemical mechanical polishing (CMP) process may be carried out to remove excess conductive layer outside the openings 30 from the top surface of the capping top layer 29. At this point, the top surface of the capping top layer 29 is revealed. A sacrificial layer 43 such as photoresist, polysilicon, or SOD may be provided on the conductive layer and into the openings 30 prior to the CMP process. Each of the cylinder-shaped storage nodes 42 comprises a horizontal bottom portion 42a and a cylinder-shaped vertical sidewall 42b that is connected to the horizontal bottom portion 42a. According to the embodiment, the height of the aforesaid cylinder-shaped vertical sidewall 42b is substantially equal to the total thickness of the template structure 20.

Figure 3:
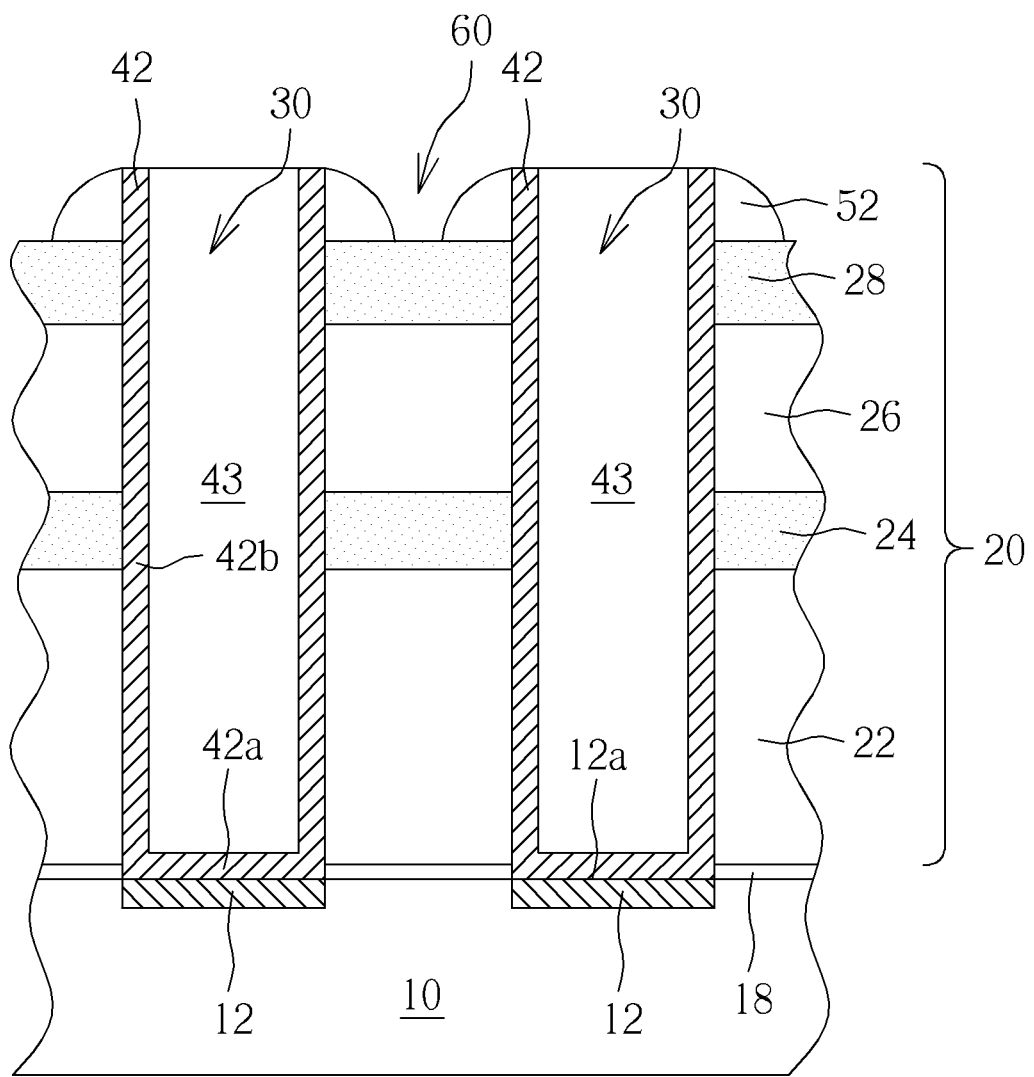
Figure 7:
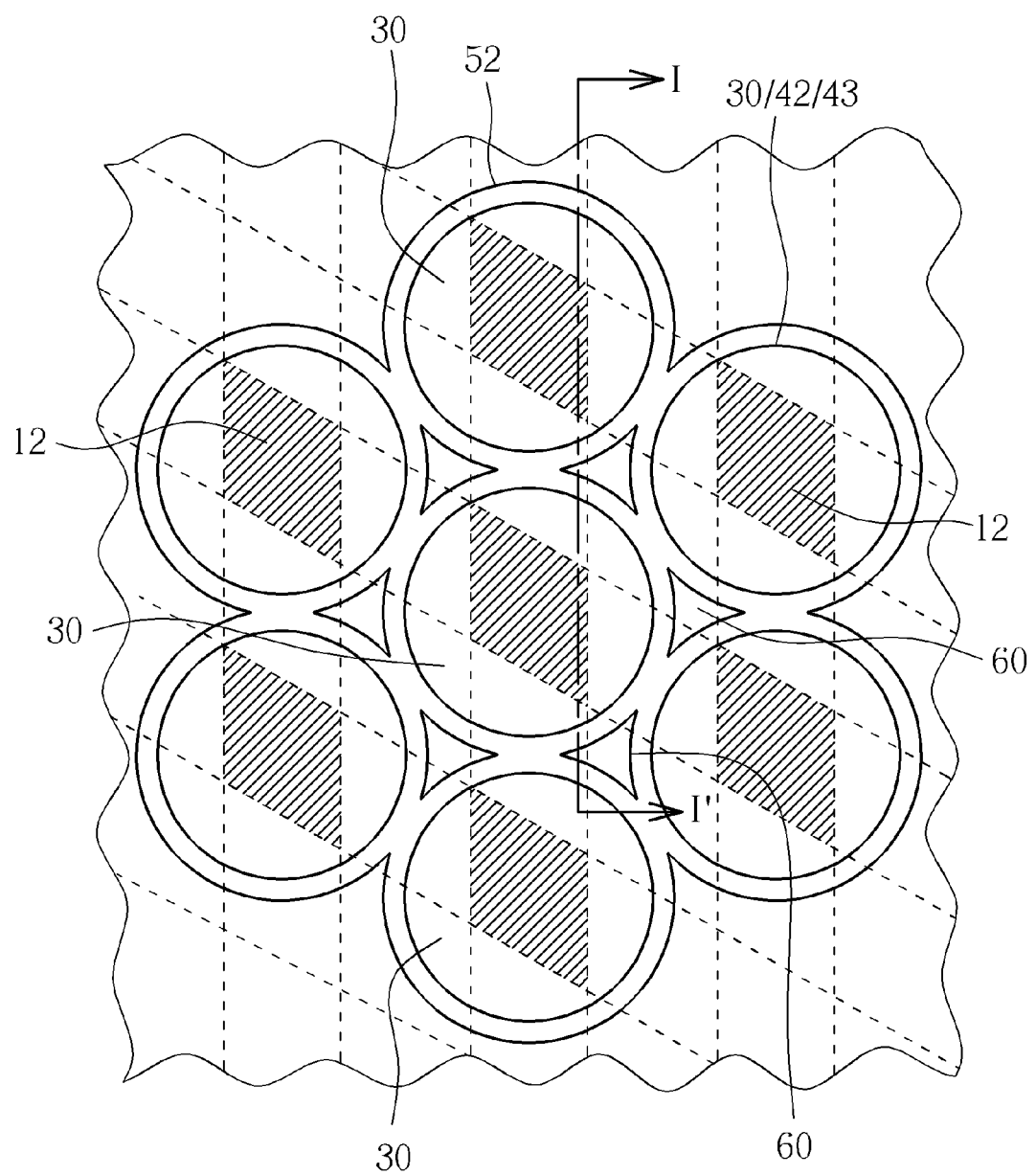
FIG. 7 is a top view showing the pattern of the annular spacer, the discontinuous gaps, and the openings in the template structure, wherein the cross-section in FIG. 3 is taken along line I-I' in FIG. 7.

As shown in FIG. 3, subsequently, an annular spacer 52 is formed around the uppermost portion of each of the cylinder-shaped storage nodes 42. The annular spacers 52 are formed on the second lattice layer 28. Discontinuous gaps 60 are formed between the annular spacers 52. To form the annular spacer 52, the capping top layer 29 is first removed from the top surface of the second lattice layer 28. A conformal spacer material layer (not explicitly shown) is deposited over the substrate 10. An anisotropic dry etching process is then performed to etch the conformal spacer material layer until the top surface of the second lattice layer 28 is exposed, thereby forming the annular spacer 52. According to the embodiment, the composition of the annular spacer 52 may be different from the composition of the second lattice layer 28 to exhibit adequate etching selectivity. For example, the annular spacer 52 may comprise silicon oxide, silicon oxy-nitride, silicon carbide, or polysilicon, and the second lattice layer 28 may comprise silicon nitride. An exemplary layout of the annular spacer 52, the discontinuous gaps 60, and the openings 30 is illustrated in FIG. 7. As shown in FIG. 7, there are six gaps 60 dispersed along the periphery of each of the openings 30. The cross-section in FIG. 3 is taken along line I-I' in FIG. 7.

Figure 4:
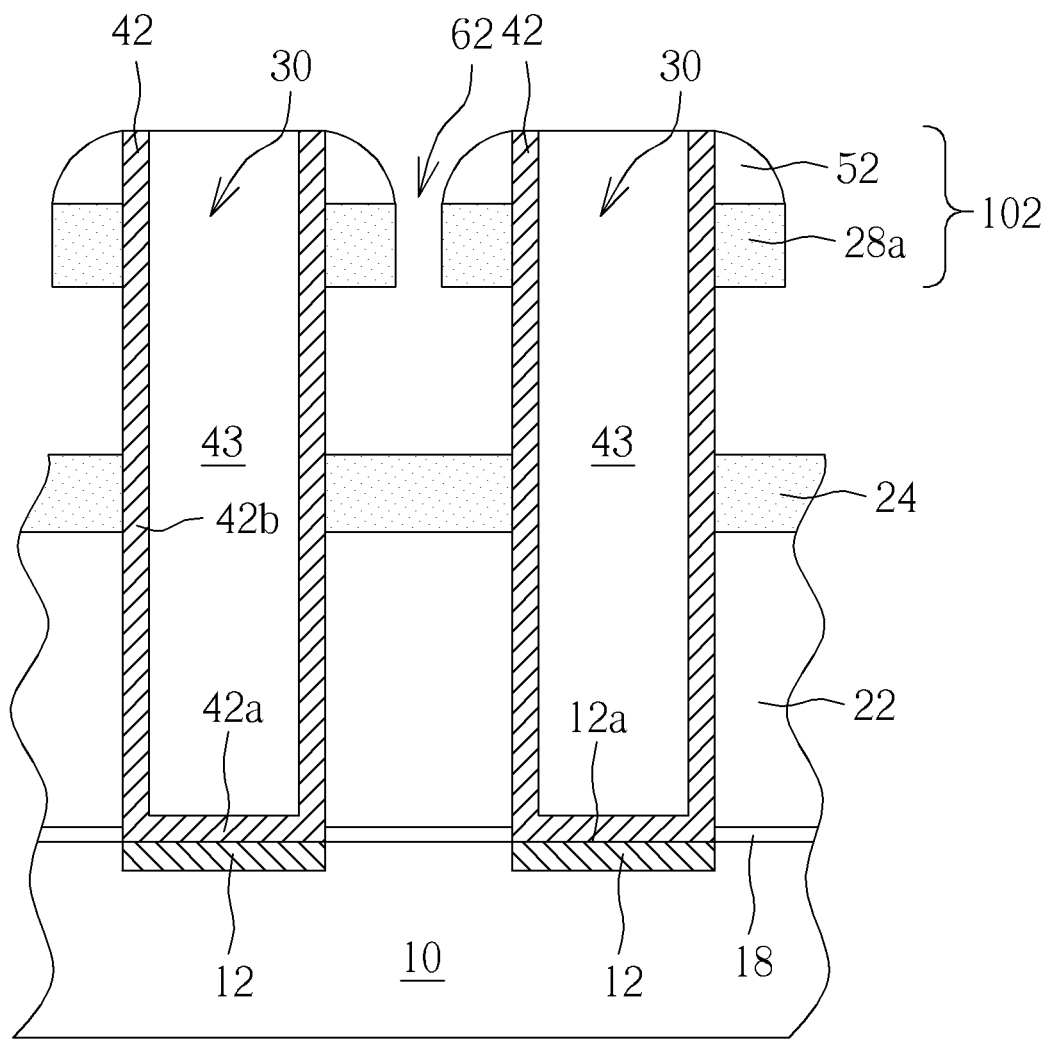

As shown in FIG. 4, after forming the annular spacers 52 and the discontinuous gaps 60, an anisotropic dry etching process is carried out to selectively etch the exposed second lattice layer 28 through the discontinuous gaps 60, thereby forming lattice structure 28a and through holes 62. The annular spacers 52 are used as an etching hard mask. The pattern of the lattice structure 28a and through holes 62 is substantially identical to that of the annular spacers 52 and the discontinuous gaps 60 as shown in FIG. 7 when viewed from the above. The through holes 62 expose a portion of the second sacrificial layer 26. Subsequently, by way of the through holes 62, an etching process such as a wet etching process is performed to remove the second sacrificial layer 26. The annular spacers 52 and the lattice structure 28a together constitute an upper support structure 102 that bridges the uppermost portions of the cylinder-shaped storage nodes 42.

Figure 5:
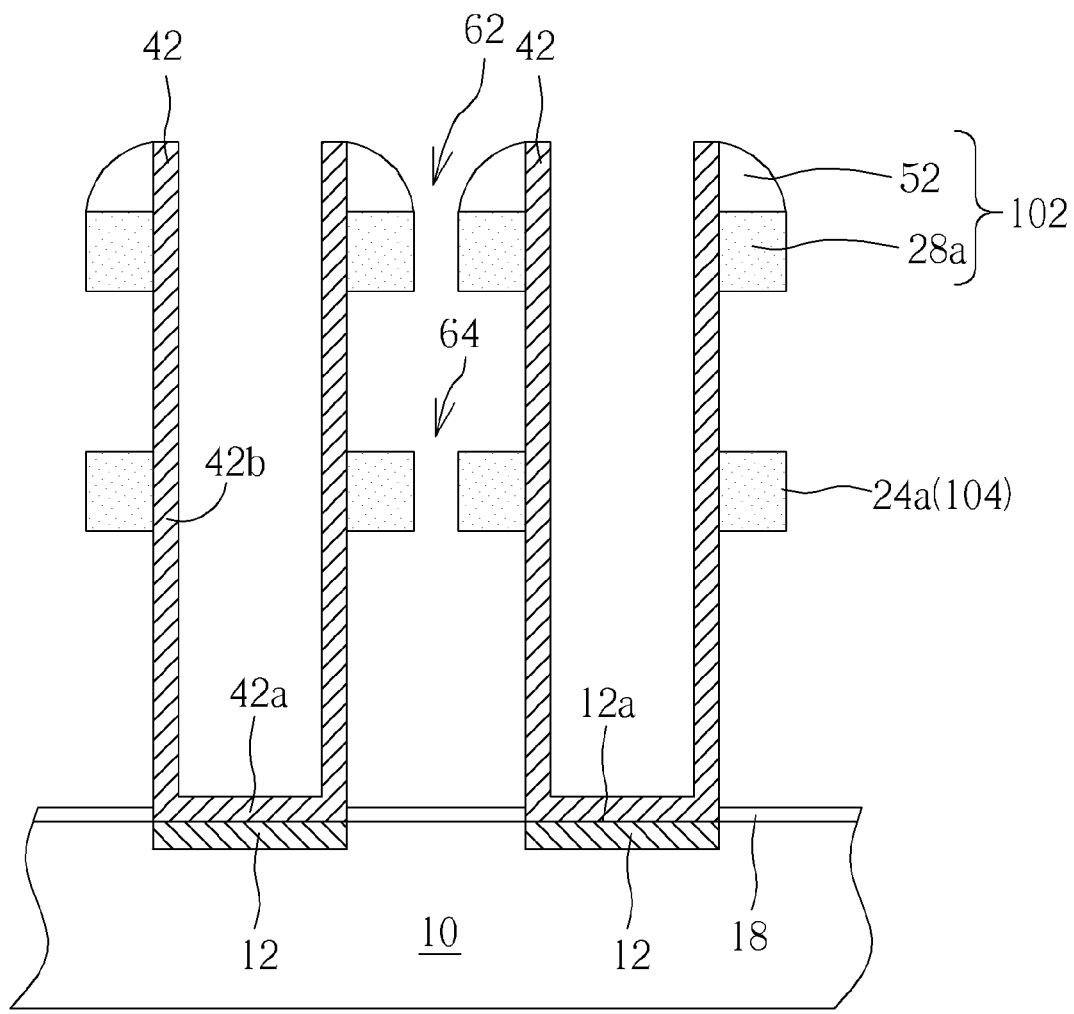

As shown in FIG. 5, likewise, using the annular spacers 52 as an etching hard mask, another anisotropic dry etching process is carried out to etch the first lattice layer 24 via the through holes 62, thereby forming lattice structure 24a and through holes 64. The pattern of the lattice structure 24a and through holes 64 is substantially identical to that of the annular spacers 52 and the discontinuous gaps 60 as shown in FIG. 7 when viewed from the above. Subsequently, by way of the through holes 62 and 64, an etching process such as a wet etching process is performed to remove the first sacrificial layer 22. The lattice structure 24a acts as a lower support structure 104 that interlocks the middle portions of the cylinder-shaped storage nodes 42. Thereafter, the sacrificial layer 43 is removed. In some cases, the annular spacers 52 may be removed together with the sacrificial layer 43.

Figure 6:
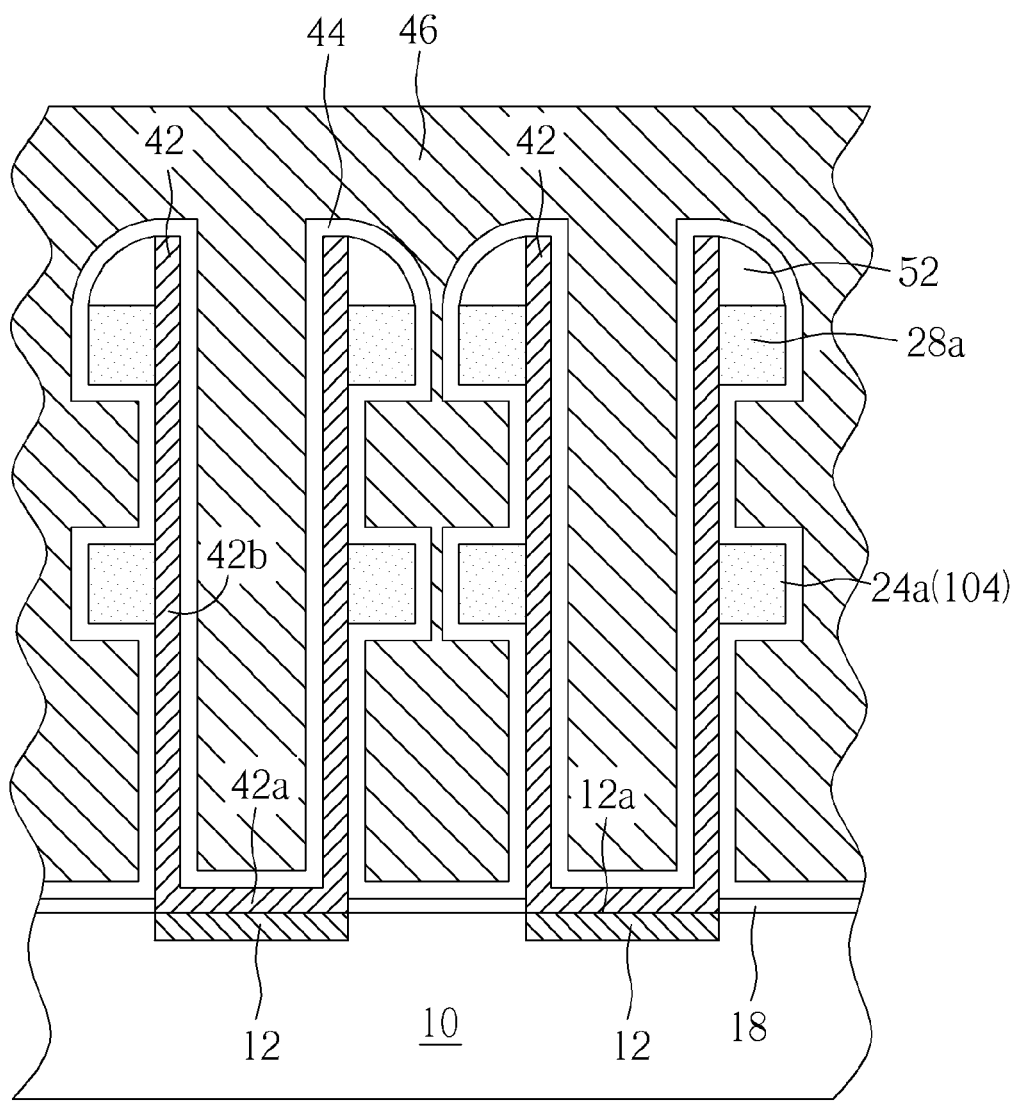

As shown in FIG. 6, subsequently, a capacitor dielectric layer 44 is deposited on the interior surface and outer surface of the cylinder-shaped storage nodes 42. The capacitor dielectric layer 44 may also cover the upper support structure 102, the lower support structure 104, and a top surface of the stop layer 18. Finally, a capacitor electrode 46 is deposited over the substrate on the capacitor dielectric layer 44. The capacitor electrode 46 may act as a capacitor cell plate and, as shown in FIG. 6, may completely fill the central portion of each of the cylinder-shaped storage nodes 42 and the space therebetween.

According to the embodiment, the capacitor dielectric layer may comprise any suitable composition or combination of compositions, such as silicon nitride, silicon dioxide, high k or ultra-high k materials. The capacitor electrode material 44 may comprise any suitable composition or combination of compositions, such as one or more of various metals (for instance, titanium, tungsten, etc.), metal-containing compositions (for instance, metal nitride, metal silicide, etc.) and conductively-doped semiconductor materials (for instance, conductively-doped silicon, conductively-doped germanium, etc.). The capacitor dielectric layer 44 and capacitor electrode 46 may be formed utilizing any suitable methods, including, for example, one or more of atomic layer deposition (ALD), chemical vapor deposition (CVD), and physical vapor deposition (PVD).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate having thereon at least one conductive region;
    a plurality of cylinder-shaped electrodes disposed on the substrate, wherein each of the cylinder-shaped electrodes has a horizontal portion that is in direct contact with the at least one conductive region and a vertical sidewall portion connecting the horizontal portion;
    an upper support structure comprising a first lattice structure that is situated in a first horizontal level that is lower than a tip portion of each of the cylinder-shaped electrodes, wherein the upper support structure further comprises an annular spacer around the tip portion of each of the cylinder-shaped electrodes; and
    a lower support structure comprising a second lattice structure that interlocks middle portions of the cylinder-shaped electrodes.

2. The semiconductor structure according to claim 1 wherein the annular spacer comprises silicon oxide or polysilicon.

3. The semiconductor structure according to claim 1 wherein the annular spacer, the upper support structure, and the lower support structure have substantially the same pattern.

4. The semiconductor structure according to claim 1 wherein the upper support structure and the lower support structure have substantially the same pattern.

5. The semiconductor structure according to claim 1 wherein the upper support structure and the lower support structure prevent the cylinder-shaped electrodes from toppling.

6. The semiconductor structure according to claim 1 further comprising a stop layer covering a top surface of the substrate.

7. The semiconductor structure according to claim 6 wherein the stop layer comprises silicon nitride.

8. The semiconductor structure according to claim 1 wherein the first lattice structure and the second lattice structure comprise silicon nitride.

9. The semiconductor structure according to claim 1 wherein a plurality of discontinuous gaps are dispersed around each of the cylinder-shaped electrodes.

10. The semiconductor structure according to claim 1 further comprising a capacitor dielectric layer conformally covers the cylinder-shaped electrodes, the upper support structure, and the lower support structure.

11. The semiconductor structure according to claim 10 further comprising a capacitor electrode on the capacitor dielectric layer.

\* \* \* \* \*